United States Patent
Solomon et al.

(10) Patent No.: US 11,369,027 B2
(45) Date of Patent: Jun. 21, 2022

(54) DISPLAY POSITIONING SYSTEM

(71) Applicant: Tangible Play, Inc., Palo Alto, CA (US)

(72) Inventors: Mark Solomon, Palo Alto, CA (US); Jon Karl Dukerschein, Pacifica, CA (US); Andrew Berwald, Palo Alto, CA (US); Ariel Zekelman, Palo Alto, CA (US); Jerome Scholler, San Francisco, CA (US)

(73) Assignee: Tangible Play, Inc., Palo Alto, CA (US)

( * ) Notice: Subject to any disclaimer, the term of this patent is extended or adjusted under 35 U.S.C. 154(b) by 0 days.

(21) Appl. No.: 16/376,889

(22) Filed: Apr. 5, 2019

(65) Prior Publication Data

US 2019/0313540 A1    Oct. 10, 2019

Related U.S. Application Data

(60) Provisional application No. 62/653,455, filed on Apr. 5, 2018.

(51) Int. Cl.
*H05K 5/02* (2006.01)
*H05K 5/00* (2006.01)
(Continued)

(52) U.S. Cl.
CPC .............. *H05K 5/0234* (2013.01); *G06T 7/80* (2017.01); *H04N 5/23218* (2018.08);
(Continued)

(58) Field of Classification Search
CPC .. H05K 5/0234; H05K 5/0017; H05K 5/0247; G06T 7/80; H04N 5/23299;
(Continued)

(56) References Cited

U.S. PATENT DOCUMENTS

D510,517 S    10/2005 Noack
D523,828 S     6/2006 Hoehn et al.
(Continued)

FOREIGN PATENT DOCUMENTS

KR    1020130133627 A    12/2013

OTHER PUBLICATIONS

International Search Report and Written Opinion issued in PCT/US2016/024303, dated Aug. 3, 2016 (11 pages).
(Continued)

*Primary Examiner* — James M Pontius
(74) *Attorney, Agent, or Firm* — VLP Law Group LLP; Michel Bohn

(57) ABSTRACT

Various implementations for a display positioning system include stand with a front a back surface being connected to form a curved bend such that the bottom edges of the front and back surface are spread out to support the stand, the front surface is further connected to a stand lip forming a stand channel between the front surface and an extended portion of the stand lip, an insert configured to rest within the stand channel of the stand and including a front plate and a back plate that extend beyond a top portion of the insert and form an insert channel, the insert channel being configured to receive a first edge of a computing device and support the computing device in an elevated position, and an adapter with an optical element that is configured to rest within a first slot in the stand when not in use.

20 Claims, 11 Drawing Sheets

(51) Int. Cl.
*G06T 7/80* (2017.01)
*H04N 5/232* (2006.01)

(52) U.S. Cl.
CPC ....... *H04N 5/23299* (2018.08); *H05K 5/0017* (2013.01); *H05K 5/0247* (2013.01)

(58) Field of Classification Search
CPC .............. H04N 5/23218; H04N 5/2252; G06F 1/1633; G06F 1/1613; G06F 1/16
USPC .......................................................... 348/839
See application file for complete search history.

(56) References Cited

U.S. PATENT DOCUMENTS

| | | | |
|---|---|---|---|
| D625,724 S | 10/2010 | Chen et al. | |
| D636,395 S | 4/2011 | Anderson et al. | |
| D640,708 S | 6/2011 | Lee | |
| D647,881 S | 11/2011 | Warner | |
| D663,777 S | 7/2012 | Lira-Nunez | |
| D666,174 S | 8/2012 | Du et al. | |
| D667,831 S | 9/2012 | Stravitz | |
| 8,490,846 B1 | 7/2013 | Wheatley et al. | |
| D693,826 S | 11/2013 | Ashida et al. | |
| 8,608,123 B2 | 12/2013 | Takahashi et al. | |
| 8,667,904 B2 | 3/2014 | Pajic | |
| D714,297 S | 9/2014 | Poulsen et al. | |
| D722,063 S | 2/2015 | Zwerner et al. | |
| D722,064 S | 2/2015 | Zwerner et al. | |
| D722,065 S | 2/2015 | Zwerner et al. | |
| D754,135 S | 4/2016 | Cromack et al. | |
| D771,055 S | 11/2016 | Sharma et al. | |
| 9,501,096 B2 | 11/2016 | Sharma et al. | |
| D787,521 S | 5/2017 | Chen | |
| 9,677,704 B1 | 6/2017 | Thelen | |
| D800,134 S | 10/2017 | McDonald | |
| 2004/0181454 A1 | 9/2004 | Manno | |
| 2006/0168865 A1 | 8/2006 | Watanabe | |
| 2010/0134984 A1 | 6/2010 | Lum et al. | |
| 2010/0320349 A1 | 12/2010 | Necessary | |
| 2012/0057278 A1* | 3/2012 | Fu | F16M 11/105 361/679.01 |
| 2013/0068917 A1 | 3/2013 | Peng | |
| 2013/0262248 A1 | 10/2013 | Kim et al. | |
| 2013/0277520 A1 | 10/2013 | Funk et al. | |
| 2014/0319304 A1 | 10/2014 | Kuan et al. | |
| 2014/0321043 A1 | 10/2014 | Liu et al. | |
| 2014/0328020 A1* | 11/2014 | Galant | F16M 11/105 361/679.56 |
| 2015/0339532 A1 | 11/2015 | Sharma et al. | |
| 2016/0142523 A1 | 5/2016 | Bartkowski | |
| 2016/0282901 A1* | 9/2016 | Sharma | G06F 1/1632 |
| 2018/0177660 A1* | 6/2018 | Davies | F16M 13/022 |

OTHER PUBLICATIONS

International Search Report and Written Opinion issued in PCT/US2019/026156 dated Jul. 3, 2019 (16 pages).
International Preliminary Report on Patentability issued in PCT/US2016/024303, dated Oct. 5, 2017 (8 pages).
International Preliminary Report on Patentability received for PCT Patent Application No. PCT/US16/024303, dated Oct. 5, 2017, 8 pages.
International Search Report and Written Opinion received for PCT Patent Application No. PCT/US16/024303, dated Aug. 3, 2016, 9 pages.
International Written Opinion received for PCT Patent Application No. PCT/US19/026156, dated Jul. 3, 2019, 7 pages.
International Preliminary Reporton Patentability received for PCT Patent Application No. PCT/US2019/026156, dated Oct. 15, 2020, 9 pages.

* cited by examiner

DISPLAY POSITIONING SYSTEM

CROSS-REFERENCE TO RELATED APPLICATIONS

The present application claims the benefit under 35 U.S.C. § 119(e) of U.S. Provisional Patent Application Ser. No. 62/653,455, entitled "Display Positioning System," filed on Apr. 5, 2018, the entire contents of which are incorporated herein by reference.

BACKGROUND

A display positioning system allows a user to situate a display, such as a tablet or mobile phone, in a stand and view the display. By positioning the display such that the screen is viewable, without requiring a user to hold the display, the user can do additional activities while also viewing the display. However, displays come in all different sizes and configurations. This requires that specific display positioning systems are designed for each of the different display sizes and configurations.

Additionally, some applications require the display to be positioned in a specific arrangement for viewing and then access the camera connected to the display for additional activities. Oftentimes, the display must be situated in an exact position in order for the camera to capture correct information to run an application or to get consistent results when the display is set up and taken down. Replicating a specific setup in order to operate the application often requires cost and time consuming setup of the display positioning system. These difficulties in setting up and using the display positioning system, along with the high costs of these specialized systems have led to limited adoption of the display positioning systems.

SUMMARY

According to one innovative aspect of the subject matter in this disclosure, a display positioning system is described. One general aspect includes a display positioning system including: a stand including a front surface and a back surface, the front surface and the back surface being connected to form a curved bend such that a bottom edge of the front surface and a bottom edge of the back surface are spread out to support the stand, the front surface is further connected to a stand lip, the stand lip forming a stand channel between the front surface and an extended portion of the stand lip; an insert, the insert being configured to rest within the stand channel of the stand and the insert including a front plate and a back plate that extend beyond a top portion of the insert and form an insert channel, the insert channel being configured to receive a first edge of a computing device and support the computing device in an elevated position; and an adapter including an optical element, the adapter being configured to rest within a first slot in the stand when not in use.

Implementations may include one or more of the following features. The system where the adapter includes a second slot configured to receive a second edge of the computing device, the second edge located opposite the first edge of the computing device when the adapter is in use. The system where the optical element rests at an angle within the adapter to redirect a field of view of a video capture device coupled to the computing device in the elevated position. The system where the insert is removable and the stand channel is configured to receive the first edge of the computing device and support the computing device in a non-elevated position when the insert is removed. The system where the adapter has a tapered shape to rest flush within the first slot. The system where the adapter is secured within the first slot by magnetically coupling the adapter within the first slot of the stand. The system where the elevated position allows the adapter to redirect a field of view of a video capture device of the computing device to a surface and the field of view of the video capture device includes a play area on the surface that is within the field of view based on the elevated position. The system where the insert includes an insert visual marker detectable by the computing device. The system where the insert visual marker detectable by the computing device represents to the computing device a configuration of the computing device. The system where the stand includes a stand visual marker detectable by the computing device. The system where the stand visual marker detectable by the computing device represents to the computing device a configuration of the computing device. The system where the stand visual marker is one of a color, a graphical marker, a raised portion of the stand, a notch, and a separable component. The system where the stand visual marker represents a calibration requirement of the computing device and the computing device may calibrate a video capture device based on the calibration requirement. The system where the calibration requirement includes one of a height of the video capture device, a type of the computing device, and a type of the video capture device. The system where the insert includes a centering feature that positions the insert in a centered position when resting within the stand channel.

One general aspect includes a platform for virtualization of a physical environment including: a stand including a front surface and a back surface, the front surface and the back surface being joined with a curved bend along a top edge of the front surface and a top edge of the back surface such that the front surface and the back surface are positioned opposite each other and support the stand, the stand further includes: a stand lip, the stand lip being connected to the front surface and having an extended portion that extends upwards and forms a stand channel between the extended portion and the front surface, the stand channel being configured to receive a first edge of a computing device and brace the computing device in an angled position; and a first slot, the first slot in a top side of the stand, the first slot being shaped to receive a camera adapter; and the adapter including a second slot and an optical element, the second slot being configured to receive a second edge of the computing device, the second edge located opposite the first edge of the computing device.

Implementations may include one or more of the following features. The platform further including: an insert configured to rest within the stand channel of the stand and the insert including a front plate and a back plate that extend beyond a top portion of the insert and form an insert channel, the insert channel being configured to receive the first edge of the computing device and support the computing device in an elevated position. The platform where the stand further includes: a cabling channel forming an access area in the stand that cables may be passed through and connect to the computing device when the stand channel receives the first edge of the computing device and braces the computing device in the angled position. The platform where the curved bend is substantially high enough above that a hand of a user may fit between the curved bend and a surface that the stand is resting on and reposition the stand on the surface.

One general aspect includes a display positioning system including: a stand configured to rest on a surface, the stand including a stand channel that is configured to receive a first edge of a computing device and position the computing device in an angled position, a first slot to secure an adapter when the adapter is not in use, and a visualization marker; the adapter including a second slot and an optical element, the second slot receiving a second edge of the computing device so as to redirect a field of view of at least a portion of a video capture device of the computing device; the adapter being secured within the first slot when not in use; and the computing device, the computing device further including: the video capture device being configured to capture a video stream of the redirected field of view including the visualization marker; a detector being configured to detect the visualization marker in the captured video stream; and a calibrator being configured to calibrate the video stream based on the visualization marker.

Other implementations of one or more of these aspects and other aspects described in this document include corresponding systems, apparatus, and computer programs, configured to perform the actions of the methods, encoded on computer storage devices. The above and other implementations are advantageous in a number of respects as articulated through this document. Moreover, it should be understood that the language used in the present disclosure has been principally selected for readability and instructional purposes, and not to limit the scope of the subject matter disclosed herein.

BRIEF DESCRIPTION OF THE DRAWINGS

The disclosure is illustrated by way of example, and not by way of limitation in the figures of the accompanying drawings in which like reference numerals are used to refer to similar elements.

The Figures depict various embodiments for purposes of illustration only. One skilled in the art will readily recognize from the following discussion that alternative embodiments of the examples illustrated herein may be employed without departing from the principles described herein.

DETAILED DESCRIPTION

Figure 1:
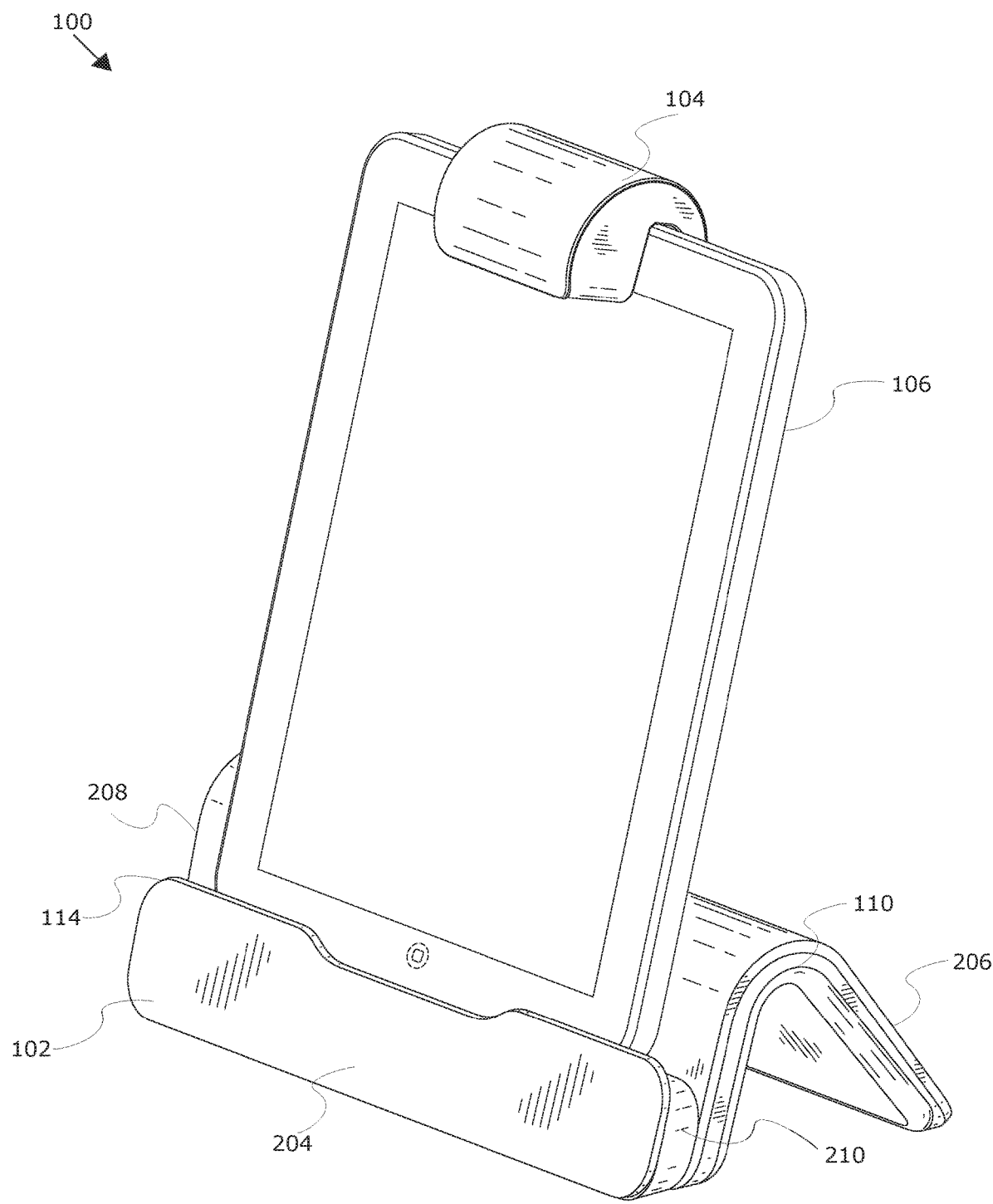
FIG. 1 is an example embodiment of a display positioning system.

FIG. 1 is an example embodiment of a display positioning system 100. In some implementations, the display positioning system may include a stand 102 and an adapter 104. As shown in the example in FIG. 1, the stand 102 may be configured to position and brace a computing device 106 in an upright and angled position and the adapter 104 may be configured to be situated over a capture device 1010 of the computing device 108 in order to redirect a field of view of the capture device 1010 (not shown).

Redirecting the field of view of the capture device 1010 allows for the capture device 1010 to capture images and/or video of a surface proximate to the stand 102. As shown in the example, by redirecting the field of view of the capture device 1010, the capture device 1010 can capture images and/or video of objects or interactions on the surface while the computing device 106 is positioned in the stand 102. The computing device 106 may also display one or more graphical user interfaces a display while the computing device 106 is positioned in the stand 102.

In some implementations, images captured using the adapter 104 may be calibrated in order for image processing techniques to fully identify objects and/or for an activity application to accurately display visualizations of objects on a display screen. These calibrations often require camera specific information. Camera specific information may include information specific to different types of cameras incorporated into different types of computing devices 106. For example, different manufacturers may use different cameras in their manufacturer specific computing devices. Furthermore, the cameras may be configured in different locations when positioned in a stand 102 as a result of different sizing options for the different computing devices.

In one example, a computing device may be a tablet with a front facing camera. Different brands may have tablets with different dimensions, such as an iPad made by Apple, a Fire Tablet made by Amazon, and/or an Android tablet made by Samsung. Each of these tablets would have a different set of calibrations requirements when placed into a stand 102 in order for the video capture device 1010 to capture video streams that can be used by an application. Information including the height of the camera and camera specific information related to the type of camera or the type of computing device 106 may be used to calibrate images captured by the camera when the adapter 104 is placed over the capture device 1010 to redirect the field of view.

As shown in FIG. 1, the stand 102 may include a stand channel 210 that can receive various types of computing devices 106 and support the computing devices at different angles necessary for a redirected field of view of the camera to capture an amount of the surface proximate to the stand 102. In some implementations, the stand channel 210 may be adapted to receive computing devices 106 that are covered by a protective case. In further implementations, the stand channel may receive computing devices 106 that have a portion of an edge exposed to be supported within the stand channel 210.

The stand 102 includes a stand lip 204 that forms a front side of the stand channel 210. In some implementations, the stand lip may include an extended portion 114 of the stand lip 204 that extends beyond the stand 204 to form a front side of the stand channel 210. The stand lip 204 may be configured to retain the computing device 106 such that when a front portion of the computing device 106 comes into contact with the interior of the stand lip 204, the stand lip 204 applies pressure to the front portion of the computing device 106 to retain the computing device 106 within the stand 102. In some implementations, the stand lip 204 may include a retaining material, such as a rubber, that has an increased resistance to keep the front portion of the computing device from sliding or moving when in contact with the retaining material.

The stand 102 may include a front surface 208 of the stand 102 that forms an opposite edge of the stand channel 210. In some implementations, the front surface 208 may be connected to the stand lip 204. In further implementations, the stand lip 204 and the front surface 208 may be formed out of a single piece of material and the stand channel 210 may represent a bend in the material to form the desired shape. The front surface 208 may extend higher in comparison to the front lip 204 and allow a back portion of the computing device 106 to rest against the front surface 208 when the computing device 106 is positioned within the stand channel 210. The front surface 208 may passively support the computing device 106 as the back of the computing device rests against the front surface 208. In some implementations, the front surface 208 may include a retaining material, such as a rubber, that has an increased resistance to retain the front portion of the computing device 106 from sliding or moving when in contact with the retaining material. The front surface 208 may be high enough such that when a computing device 106 is resting in the stand channel 210 of the stand 102, the stand 102 is stable, even with a tall computing device 106 that exerts pressure at a top edge by changing a center of gravity of the positioning system as a result of the angle the computing device 106 may be leaning.

The stand 102 may include a curved bend 110 where one side of the curved bend 110 is formed out of a top edge of front surface 208 and the other side of the curved bend 110 is formed out of a top edge of a back surface 206. The curved bend 110 may form a triangular shape and may allow for the front surface 208 and the back surface 206 to act as legs of the stand 102 and allow the stand 102 to rest on the surface. In some implementations, the curved bend 110 may be designed to be ergonomically grippable. For example, the curved bend 110 may be higher on an inside edge and allow a whole hand of a user to lift and move the stand 102 by lifting up and repositioning the inside edge of the curved bend 110. In further implementations, the curved bend 110 may be sized to allow a child's hand to fit and easily move the stand 102 at the curved bend 110, while an adult sized hand would fit two fingers. Other implementations and sizes are also contemplated. The specific design of the curved bend 110 may facilitate moving and carrying the stand 102 while a computing device is resting within the stand.

The back surface 206 may be positioned opposite the front surface 208 with the bottom edges of the front surface 208 and the back surface 206 resting spread out away from each other on the surface. In some implementations, the front surface 208 and the back surface 206 may be formed out of a single material and the curved bend 110 may be a bend in the single material that forms the front surface 208 and the back surface 206. The back surface 206 may be angled to provide support for a computing device 106 when the computing device 106 is resting in the stand 102. In some implementations, the back surface 206 may include additional weights integrated into the stand 102 to keep the stand 102 stable and retain the computing device 106.

In some implementations, the stand 102 may include stand visual markings. The stand vision markings may be specific marks, characters, images, objects, colors, graphical markers, raised portions of the stand 102, notches, separable components, and other configurations, etc. that may be added to, molded onto, or otherwise included on the stand 102. When the adapter 104 redirects the field of view of a camera, the visual markings are included in the field of view and detectable by a processor analyzing images captured by the camera. The visual markings allow for an application executed on a computing device 106 to identify which parts of the display positioning system (e.g., stand, adapter, insert, etc.) are being used in a configuration and provide that information to a calibrator that may use specific information about each component to perform calibrations of images captured by the camera. In some implementations, the visual markers may represent to a calibration engine specific calibration requirements that the calibration engine can use to calibrate the video capture device 1010. The visual markings may be unobtrusive and located on an edge of a component. In some implementations, the visual markings may be incorporated into a design or an object detectable by the computing device 106.

The adapter 104 may include a slot adapted to receive and retain the adapter on an edge of a computing device 106. The adapter 104 may be configured to be positioned over a camera and/or video capture device 1010 of the computing device 106 and redirect the field of view as described elsewhere herein. The adapter 104 may include an optical element, such as a mirror that is configured to redirect the field of view of the video capture device 1010. In some implementations, the mirrors and/or lenses can be polished or laser quality glass. In other examples, the mirrors and/or lenses may include a first surface that is a reflective element. The first surface can be a coating/thin film capable of redirecting light without having to pass through the glass of a mirror and/or lens. In an alternative example, a first surface of the mirrors and/or lenses may be a coating/thin film and a second surface may be a reflective element. In this example, the lights passes through the coating twice, however since the coating is extremely thin relative to the glass, the distortive effect is reduced in comparison to a conventional mirror. This mirror reduces the distortive effect of a conventional mirror in a cost effective way.

In another example, the adapter 104 may include a series of optical elements (e.g., mirrors) that wrap light reflected off of the surface located in front of the computing device 106 into a rear-facing camera of the computing device 1046 so it can be captured. The adapter 104 could also adapt a portion of the field of view of the video capture device 1010 (e.g., the front-facing camera) and leave a remaining portion of the field of view unaltered so that multiple scenes may be captured by the video capture device 1010. The adapter 104 could also include optical element(s) that are configured to provide different effects, such as enabling the video capture device 1010 to capture a greater portion of the play area. For example, the adapter 104 may include a convex mirror that provides a fisheye effect to capture a larger portion of the play area than would otherwise be capturable by a standard configuration of the video capture device 1010.

Figure 4:
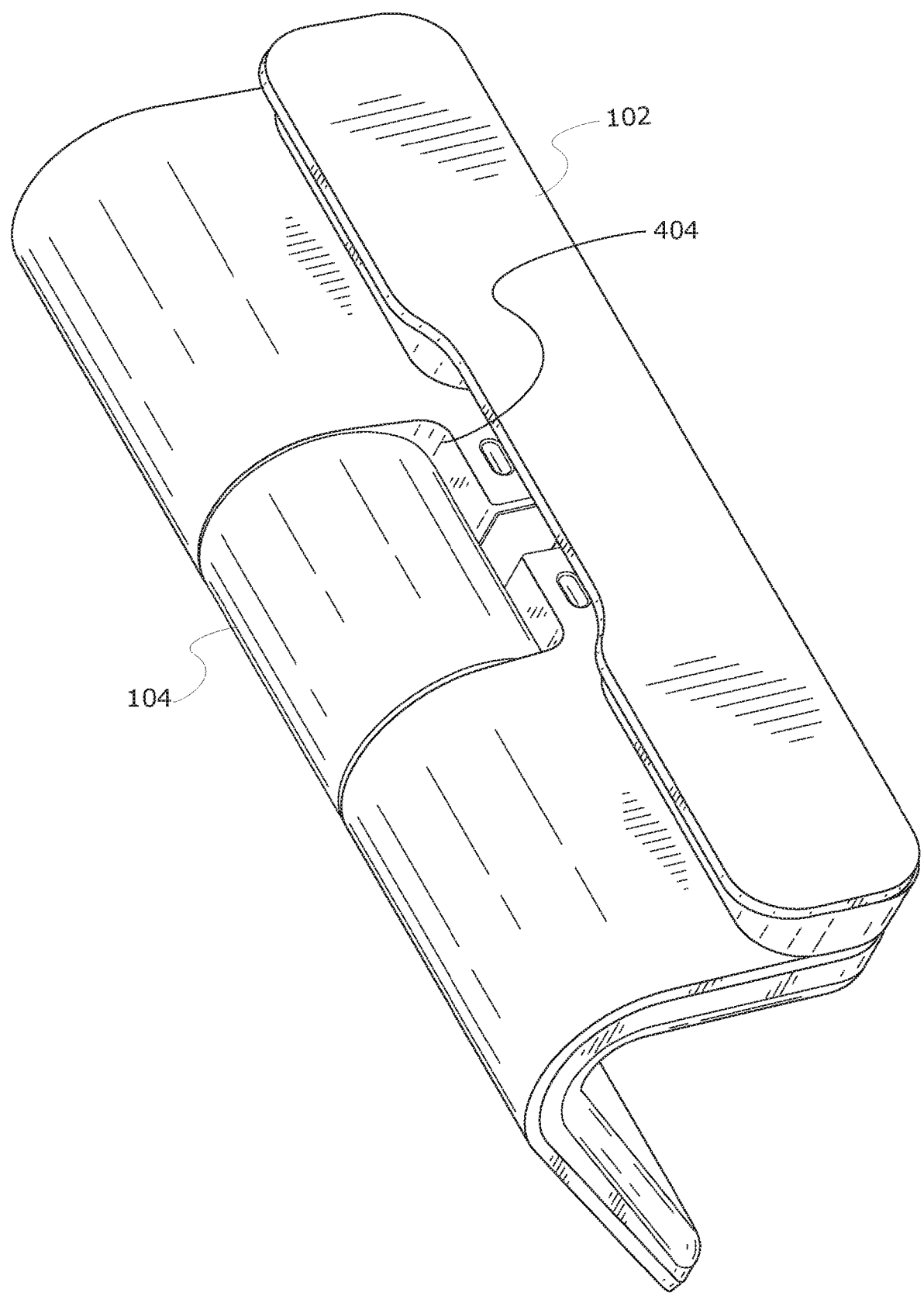
FIG. 4 is an example embodiment of a display positioning system.

In some implementations, such as the example shown in FIG. 4, the adapter 104 may be configured to be retained in a slot 404 of the stand 102 when not in use. In some implementations, the adapter 104 may be retained within the slot 404 using magnetic coupling between magnetic material integrated into the adapter 104 and corresponding magnetic material integrated into the slot 404. In further implementations, the adapter 104 may be retained in the slot by tension that is applied between the sides of the adapter 104 and the sides of the slot 404. In some implementations, the adapter 104 may fit within the slot 404, such that the adapter does not block the stand channel 210, allowing for a computing device 106 to be supported in the stand 102 while the adapter is retained in the slot 404. This allows for the stand 102 to support a computing device 106 just as a display holder, and the adapter 104 is secured, instead of being loose and potentially separated (e.g., lost, etc.) from the rest of the stand 102. This allows for the stand 102 to provide the computing device 106 to be more accessible to view and play/interact with. The adapter 104 when used with the stand 102 and/or insert 202 provides for proper mirror positioning at the appropriate angle to get the video capture device 1010 located a desired distance from the surface for image capture and/or calibration.

Figure 2:
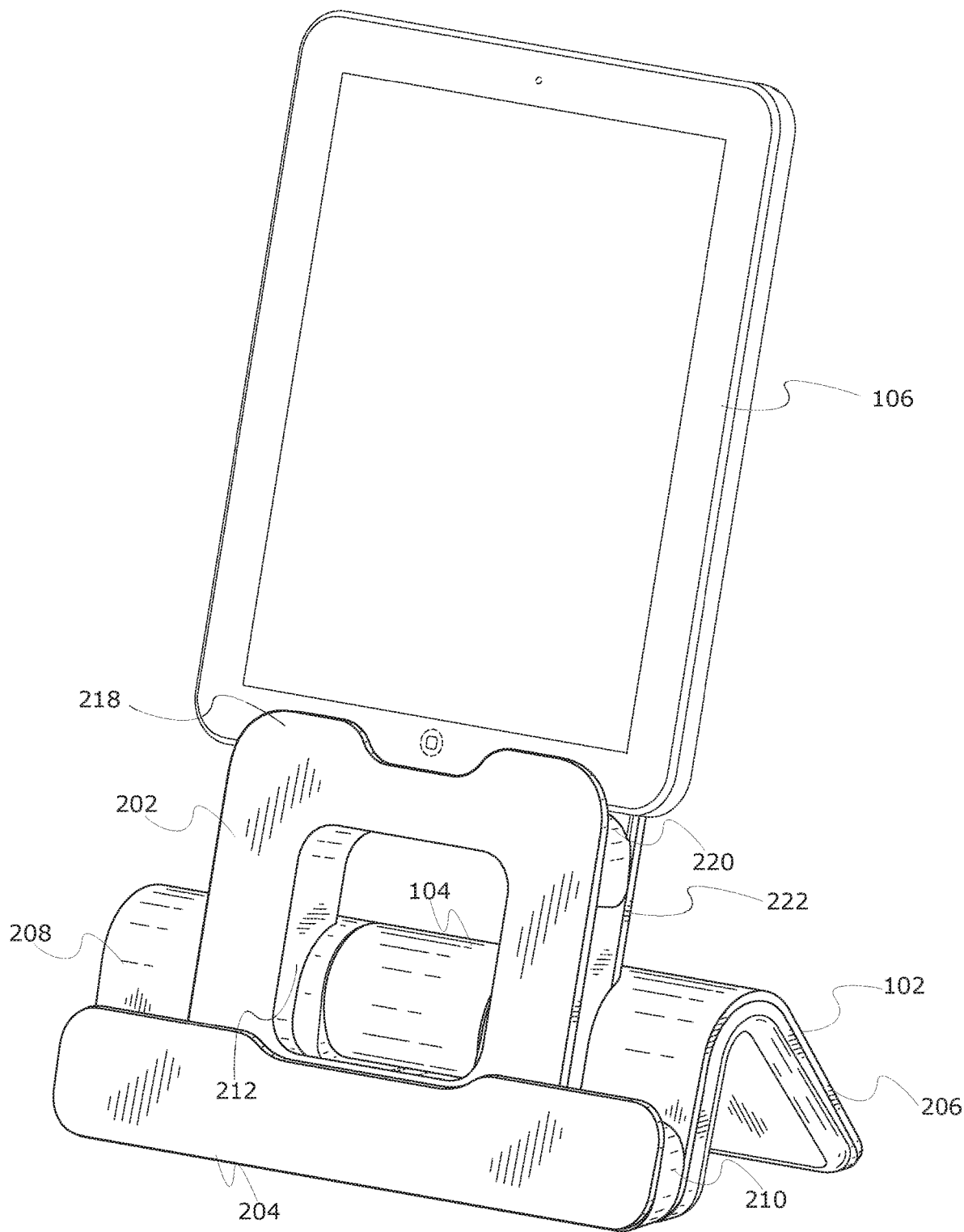
FIG. 2 is another example embodiment of a display positioning system.

FIG. 2 shows another example embodiment of the display positioning system. In some implementations, as shown in FIG. 2, the stand 102 may be coupled to an insert 202. The insert 202 may be adapted to hold a computing device 106 at a raised height. Some computing devices 106 include video capture devices 1010 that have a field of view that may not include an entire play area on a surface, when the computing device 106 is placed in the stand 102. By placing such a computing device in the insert 202, the camera height is increased by the size of the insert 202 and the camera is able to capture a larger field of view at the increased height. The insert 202 may be used to correctly position a variety of computing devices 106 that would otherwise not be able to capture a large enough field of view for various executable applications. The increased height afforded by the insert 202 accommodates camera angles on computing devices 106 that previously had too small of a field of view when redirected by the adapter 104 to capture enough of the play area on a surface.

The insert 202 may be adapted to rest in and/or couple to the stand channel 210. In some implementations, the insert 202 may snap into or couple to specific portions of the stand 102 and may further include centering features to ensure correct positioning of the insert 202 within the stand channel 210. In some implementations, the centering feature may only allow the insert 202 to be inserted so that the insert 202 is in a centered position in the stand 102. In some implementations, the insert 202 may include curved cutouts that are designed to rest flush with the front surface 208 of the curved base. In further implementations, the curved cutouts and/or the front surface 208 of the curved base may include magnetic and/or other coupling mechanisms to further retain and hold the insert in place.

The insert 202 may include an insert channel 220, which similar to the stand channel 210 is configured to receive and support an edge of the computing device. The insert channel 220 may be formed out of a front plate 218 forming a front surface of the insert 202 and a back plate 222 forming a back surface of the insert 202. The front plate 218 and the back plate 222 may extend upward and form the insert channel 220. The insert channel 220 may include the front plate 218 that acts similar to the stand lip 204 to support a front edge of the computing device 106 and properly position the computing device 106 at a correct angle. In some implementations, the insert channel 220 may include rubber molding to assist in supporting and retaining the surfaces of the computing device 106 that are in contact with the insert channel 220. In some implementations, when a computing device 106 is positioned in the insert 202, the display positioning system has a higher center of gravity. To accommodate for the higher center of gravity, the stand 102 and/or insert 202 may include additional weights to keep the display positioning system stable and upright.

In some implementations, the insert 202 has a locking mechanism that couples the insert 202 to the stand 102 such that the two components can be moved around and carried similar to how the stand 102 is described as being carried elsewhere herein. The insert 202 may include an adapter cutout 212 to that can be grasped and allow fingers of a hand to wrap around the adapter cutout 212 to assist in moving and positioning the stand 102 and insert 202.

In some implementations, the stand 102 and/or adapter 104 may be static carriage for the computing device 106 that allows the computing device 106 to lean at the desired angle simply by placing the computing device 106 in the and allowing the computing device 106 to rest against the surfaces of the stand 102 and/or insert 202. In further implementations, different receiving mechanisms are contemplated. For example, the stand channel 210 may include a toaster type mechanism that receives an edge of a computing device 106 and when the computing device 106 is pressed in, the toaster type mechanism may click into place and retain the computing device 106 at the specific angle. In further implementations, the toaster type mechanism may be configured to receive different types of computing devices 106 and click the different types of computing devices 106 in at different angles. This toaster type mechanism would allow for different thicknesses of computing devices 106 (such as if installed in cases, etc.) and not have to have different bases and/or inserts for different types of devices.

In another example, the stand channel 210 may include a sliding plate that holds an edge of a computing device 106 at different depths and allows for depth adjustments with adjustable dials based on the type of computing device 106. In further examples, an application executed on a computing device 106 may provide adjustment instructions that allow a user to adjust the dials and correctly position the computing device 106 based on the adjustment instructions. In further implementations, a spring that would change dimensions based on the size of the computing device allows the edge of the computing device 106 to rest on the spring at the correct compression.

Figure 3:
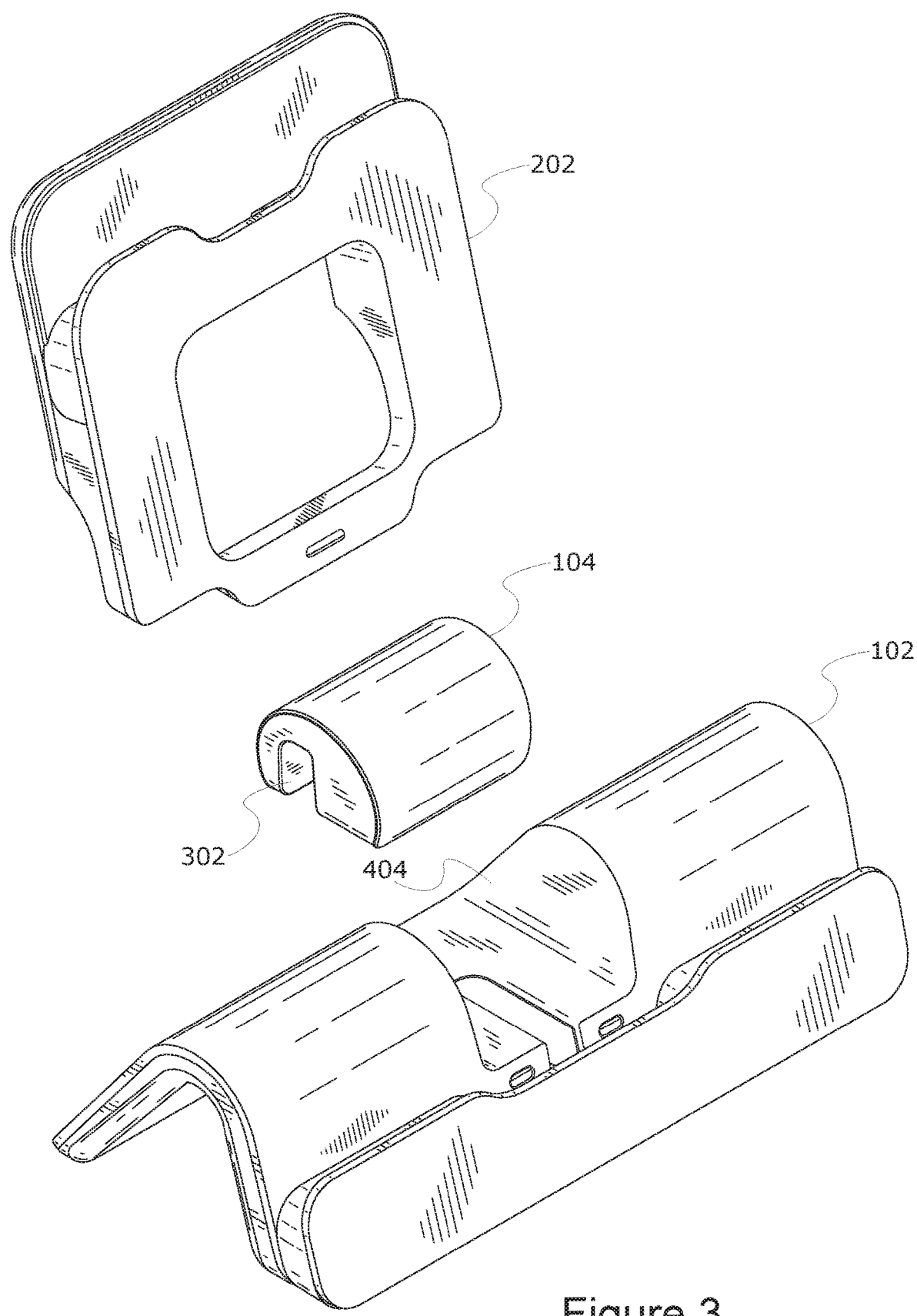
FIG. 3 is an example embodiment of the components of a display positioning system.

FIG. 3 is an example embodiment of a display positioning system. As shown in FIG. 3, the stand 102, adapter 104, and the insert 202 are each separable components that can be coupled together as shown in FIGS. 1 and 2. The stand 102 can position a computing device 106 as shown in FIG. 1. The stand 102 can further position the computing device 106 in an elevated position as shown in FIG. 2 with the insert 202. In the elevated position, the field of view of the video capture device 1010 is larger than in a non-elevated position and the video capture device 1010 can capture a greater portion of a play area adjacent to the stand 102. As shown in FIG. 3, the adapter 104 may include a slot 302. The slot 302 may correspond in dimensions to an edge of the computing device 106, such as a top edge of the computing device 106. The slot 302 may be wide enough for the adapter 104 to receive the edge of the computing device 106 within the slot and retain the adapter 104 in position on the computing device 106. As shown in FIG. 3, the stand 102 may be rounded on top and in some implementations may include the slot 404 for the adapter 104 to be placed when not in use. An external housing of the adapter 104 may be a tapered shape that is configured to rest flush with the rest of the rounded top of the stand 102 when the adapter 104 is placed within the slot 404 as shown in FIG. 4.

FIG. 4 is an example embodiment of a display positioning system. As shown in FIG. 4, the adapter 104 is placed within the slot 404 and the adapter 104 rests flush with the top of the stand 102. As described elsewhere herein, the adapter 104 may be secured within the slot 404 to reduce the risk of loss of the adapter 104. It should be understood that the adapter 104 could be placed in other configurations for storage on the stand 102, such as in a compartment/recess in a bottom or side of the stand 102, etc.

Figure 5:
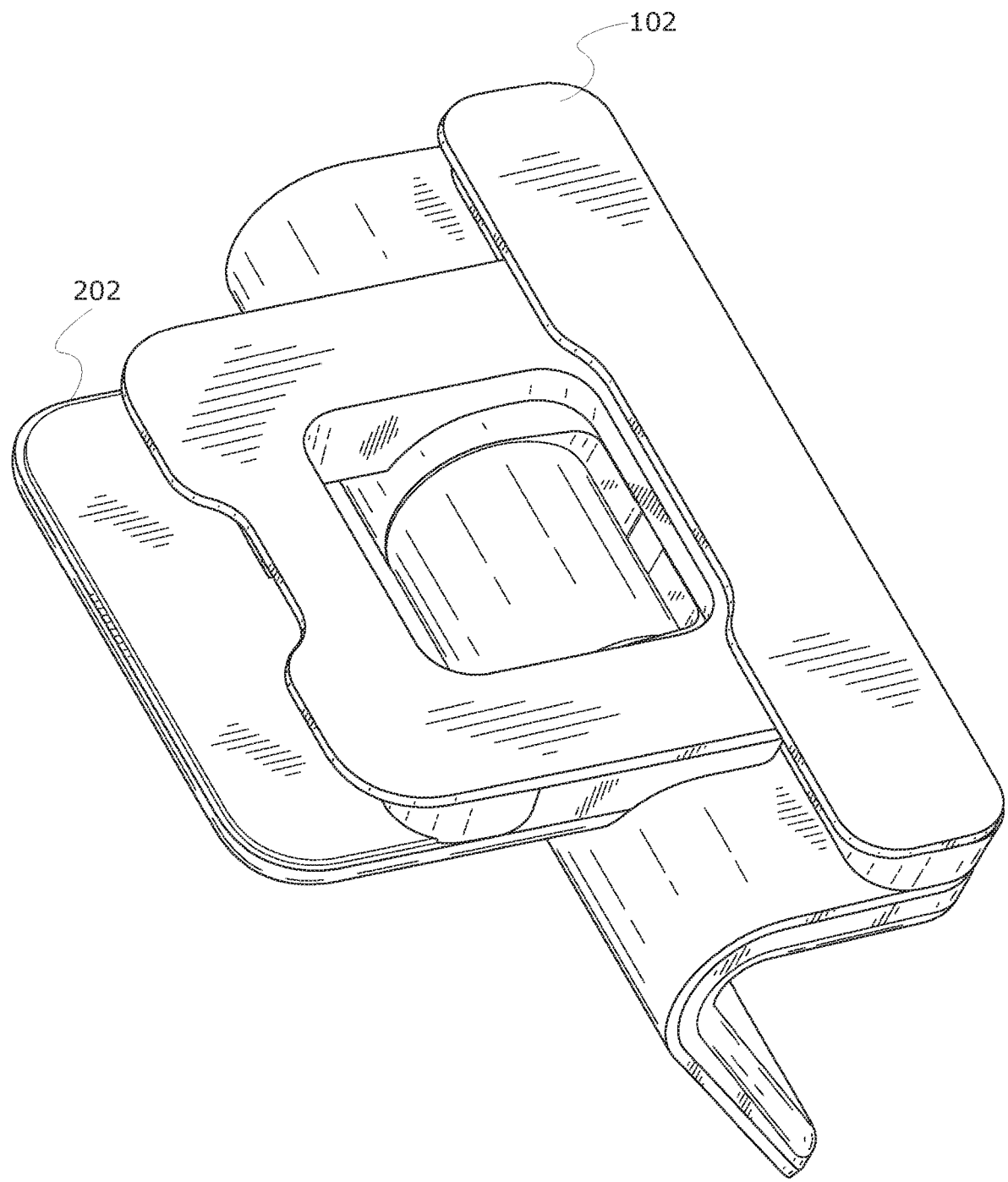
FIG. 5 is another example embodiment of a display positioning system.

FIG. 5 is an example embodiment of a display positioning system. As shown in FIG. 5, the insert can be positioned within the stand channel 210 of the stand 102. The insert 202 may include cutout portions on the back plate 222 to allow the insert 202 to sit flush against the curved bend 110 of the stand 102. It should be understood that the insert 202 can be configured in a variety of different shapes and is not limited to the shape presented in the figures. In some implementations, the insert 202 may include visual markings, such as insert visual markings, that are detectable by the computing device 106. The insert visual markings may represent to the computing device 106 a configuration, specifically, that the computing device 106 is positioned in the stand 102 with the insert 202. Similar to the stand visual markings, the insert visual markings may be graphical objects, notches, molds, ridges, text, color, etc.

Figure 6:
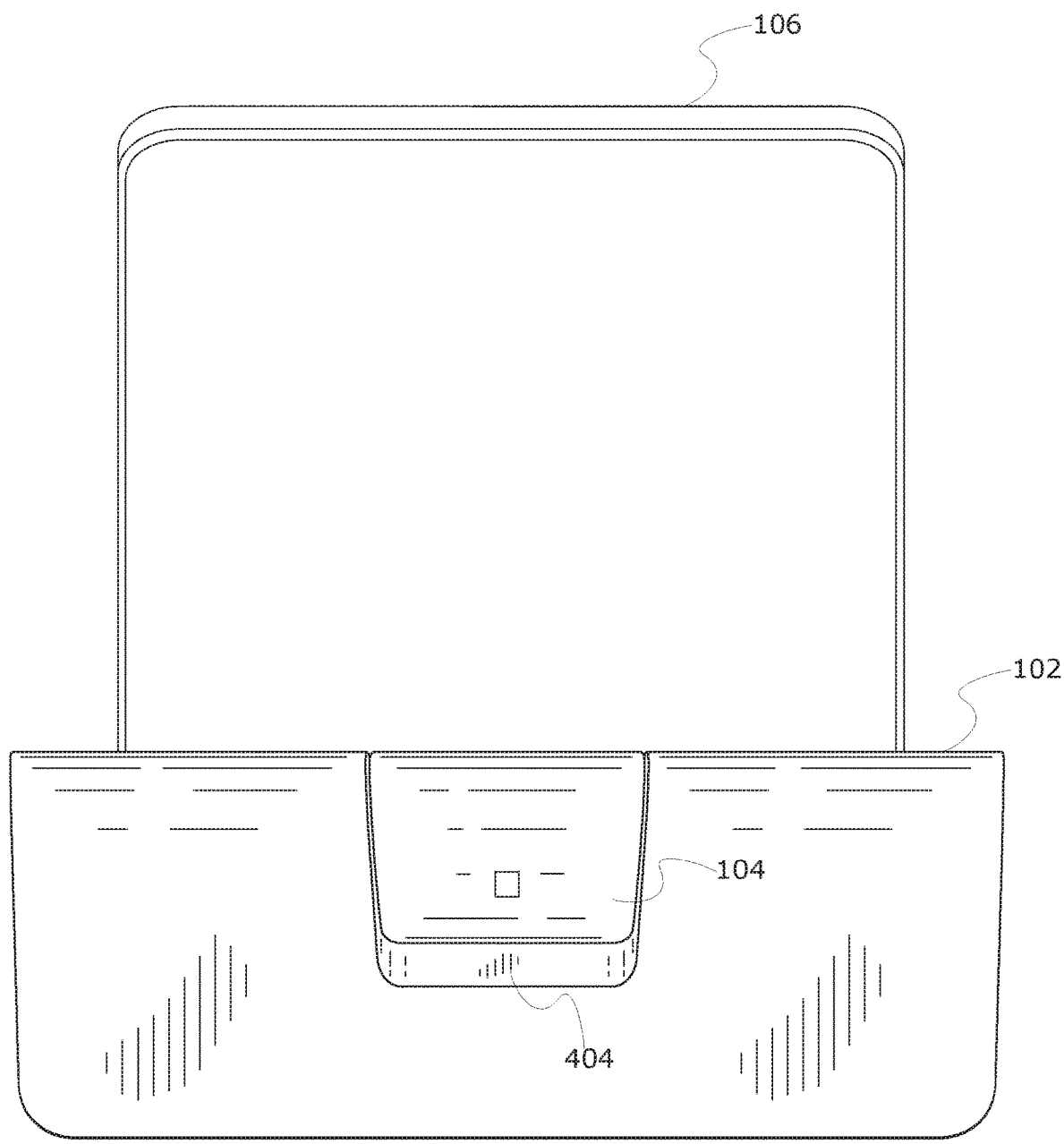
FIG. 6 is a back view of an example embodiment of a display positioning system.

FIG. 6 is a back view of an example embodiment of the display positioning system. As shown in FIG. 6, the adapter 104 may sit flush within the slot 404 of the stand 102. In some implementations, a gap may be present between the back edge of the adapter 104 and the slot 404 that allows a user to grip the adapter 104 when removing the adapter 104 from the slot 404. In other implementations, a release mechanism may be used to remove the adapter 104 from the slot 404, such as a rod that presses the adapter 104 up and overcomes the magnetic coupling between the adapter 104 and the slot 404.

Figure 7:
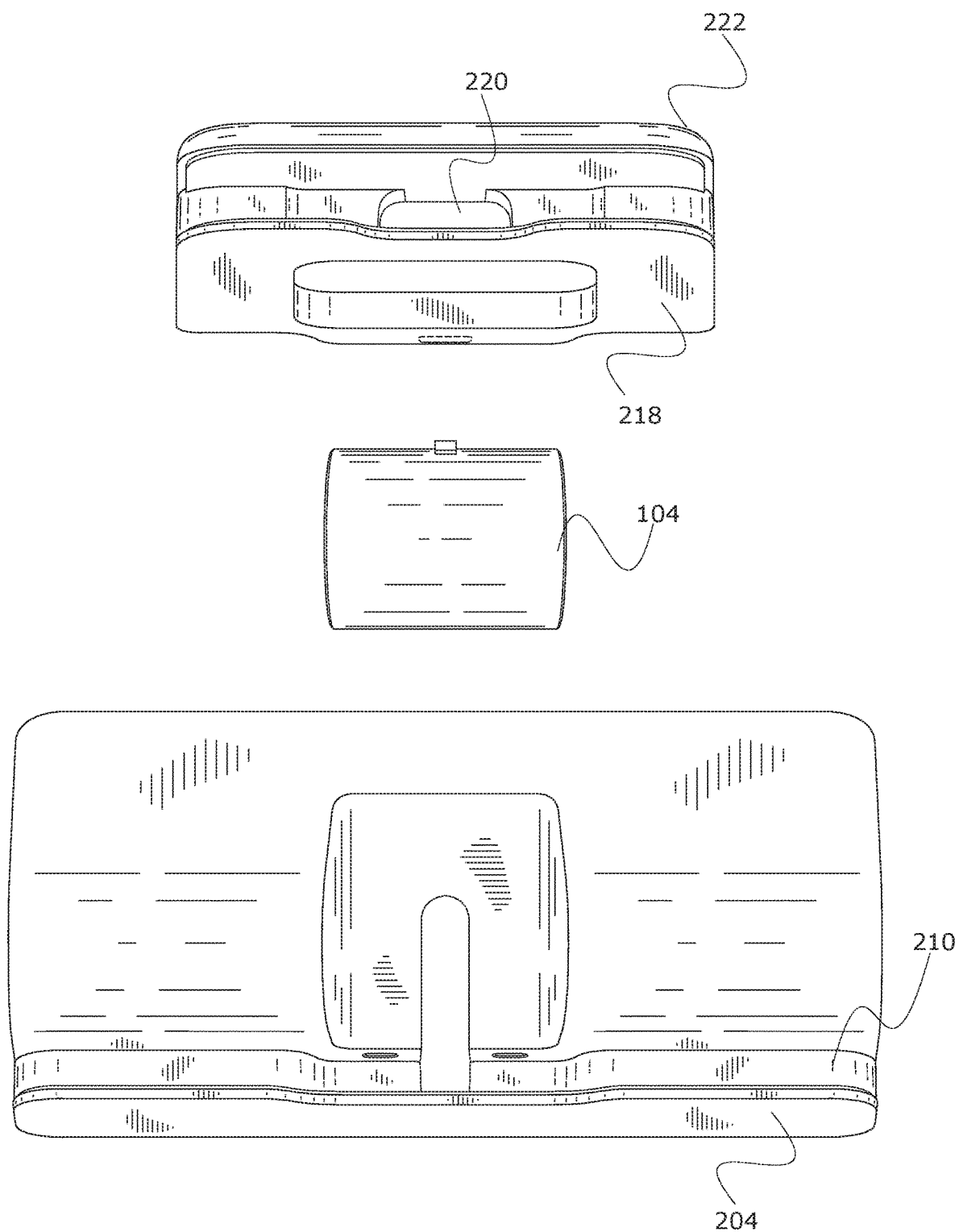
FIG. 7 is a top view of an example embodiment of a display positioning system.

FIG. 7 is a top view of an example embodiment of the display positioning system. As shown in FIG. 7, in some implementations, the stand channel 210 may extend along the entire width of the stand 102. In further implementations, the stand channel 210 may be closed on the ends and the dimensions may be configured to receive the bottom edge of the computing device 106. In some implementations, the insert channel 220 may extend along the entire width of the insert 202. In further implementations, the insert channel 220 may be closed on the ends and configured to receive the bottom edge of the computing device 106.

Figure 8:
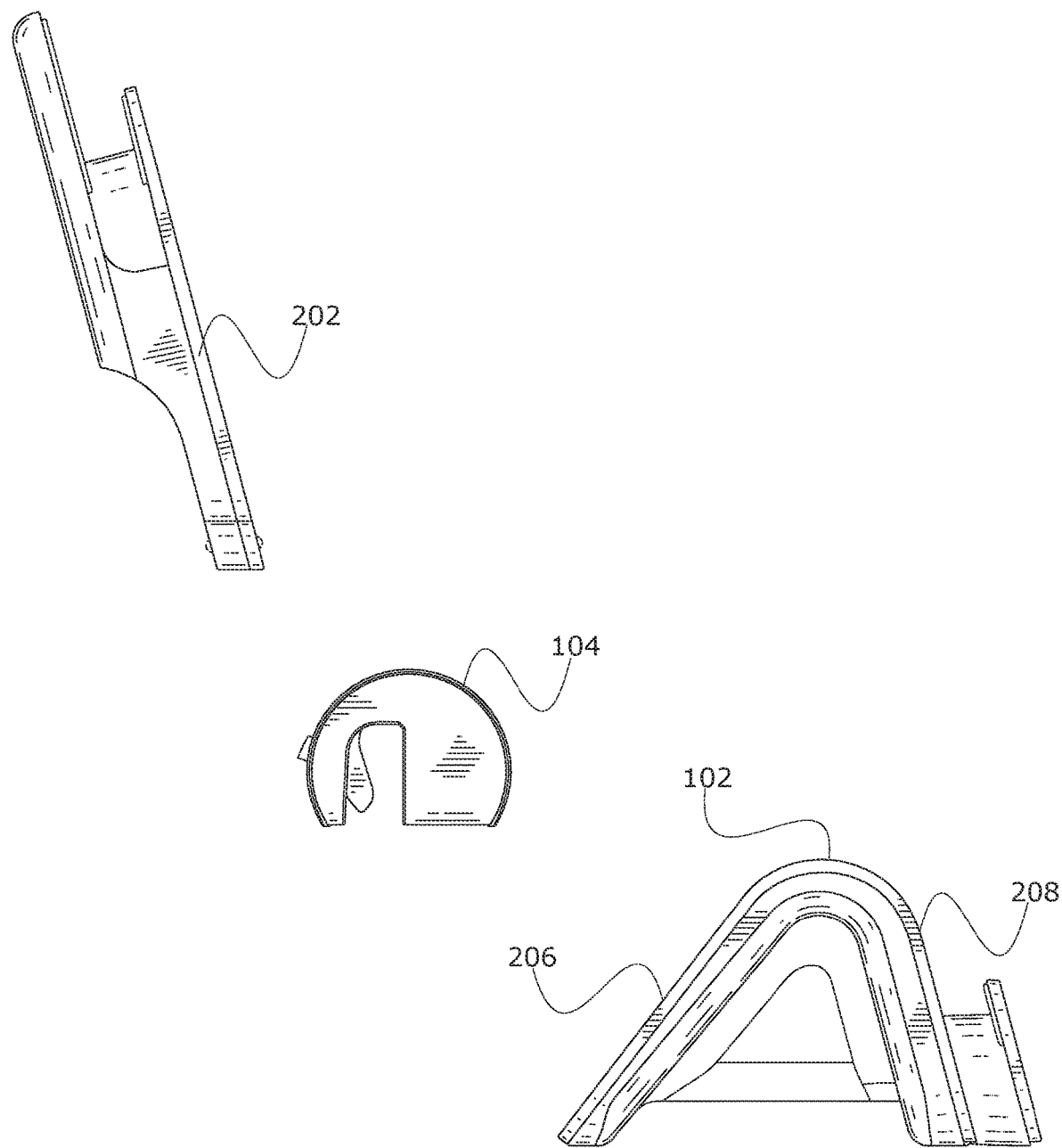
FIG. 8 is a side view of an example embodiment of a display positioning system.

FIG. 8 is a side view of an example embodiment of the display positioning system. As shown in FIG. 8, in some implementations, the back surface 206 may extend outward at a greater angle than the front surface 208. In some implementations, the back surface 206 may extend outward at a greater angle to increase the stability of the stand 102, although other configurations are also contemplated.

Figure 9:
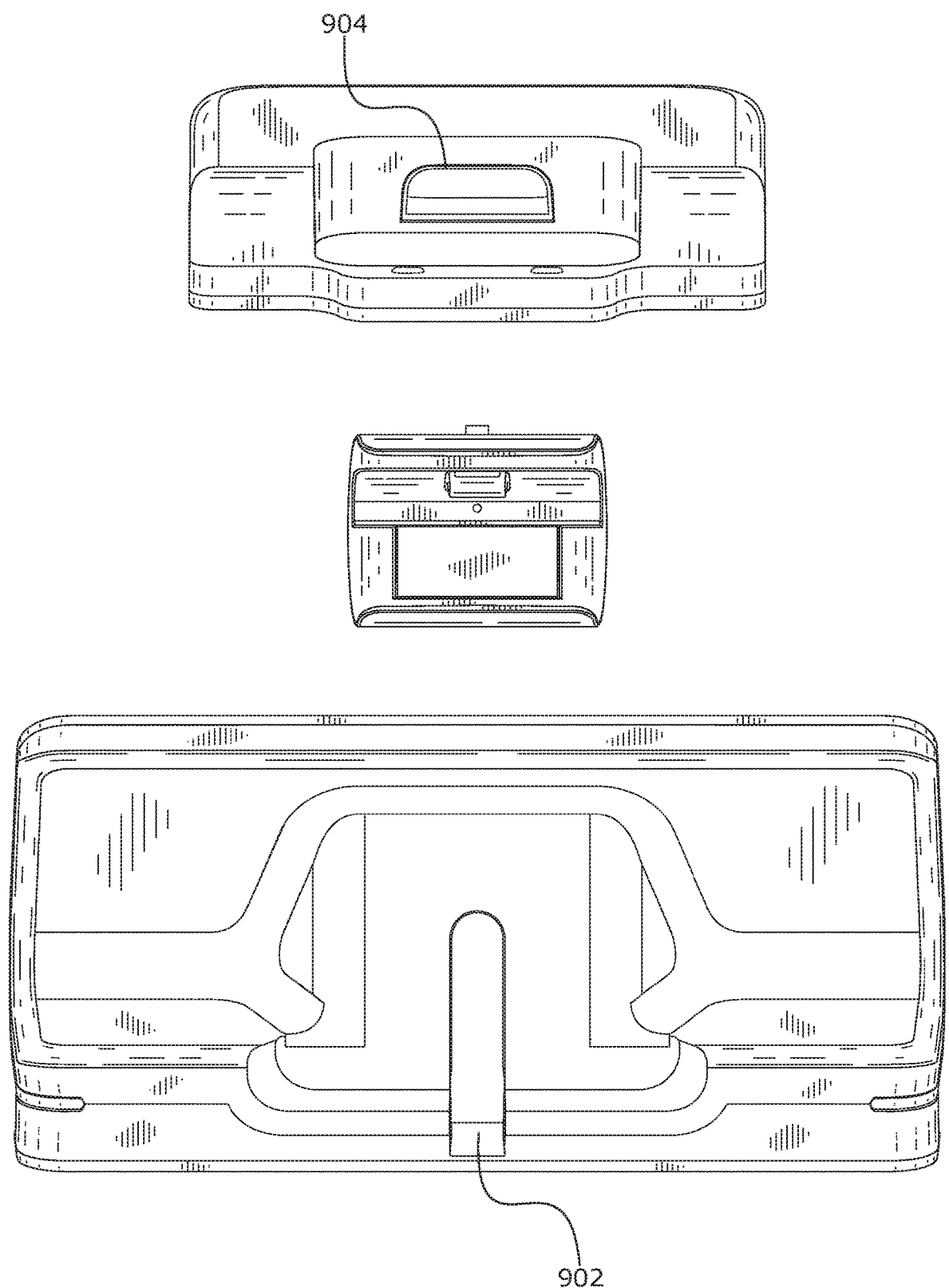
FIG. 9 is a bottom view of an example embodiment of a display positioning system.

FIG. 9 shows a bottom view of an example embodiment of a display positioning system. In some implementations, the bottom of the stand 102 may include a slot 902 on the bottom that can be adapted to receive portions of various platforms, such as a car track platform and the slot allows for easy positioning and retaining of the stand 102 on such platforms. In some implementations, the stand 102 may have one or more magnetic components integrated into a front (or additional surface) of the stand 102, to allow the stand 102 to couple to and/or interact with one or more tangible objects and/or platforms.

In some implementations, the stand 102 may have a cabling channel may be formed as an access area in the slot 902 that allows charging cables (as well as additional connecting components) to be fed through the cabling channel and connect to the computing device while the computing device is positioned in the stand 102. In some implementations, the insert 202 may also include an insert cabling channel 904 that further allows cables to pass through the insert cabling channel and connect to the computing device 106 when the computing device 106 is positioned in the insert 202.

It should be understood that the surface on which the stand 102 is situated is depicted as substantially horizontal in FIG. 1, it should be understood that the surface and the play area can be vertical or positioned at any other angle suitable to the user for interaction. The surface can have any color, pattern, texture, and topography. For instance, the surface can be substantially flat or be disjointed/discontinuous in nature. Non-limiting examples of a surface include a table, desk, counter, ground, a wall, a whiteboard, a chalkboard, a customized surface, etc. In some implementations, the surface may be preconfigured for certain activities within the play area.

Figure 10:
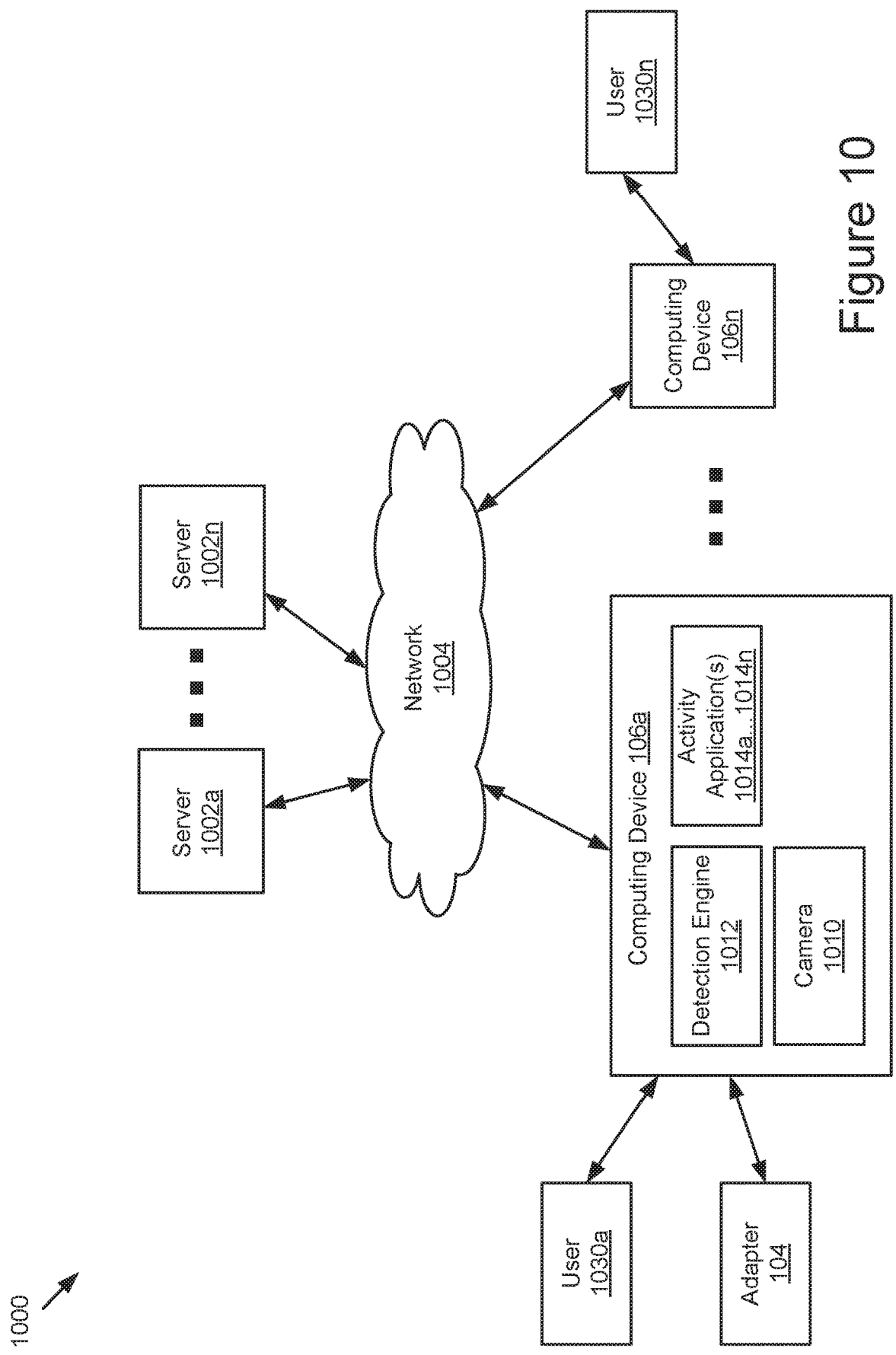
FIG. 10 is a block diagram illustrating an example computer system for use with the display positioning system.

FIG. 10 is a block diagram illustrating an example computer system 1000 for that may be used with the display positioning system. The illustrated system 1000 includes computing devices 106a . . . 106n (also referred to individually and collectively as 104) and servers 1002a . . . 1002n (also referred to individually and collectively as 1002), which are communicatively coupled via a network 1004 for interaction with one another. For example, the computing devices 106a . . . 106n may be respectively coupled to the network 1004 via signal lines and may be accessed by users 1030a . . . 1030n (also referred to individually and collectively as 1030). The servers 1002a . . . 1002n may be coupled to the network 1004 via signal lines. The use of the nomenclature "a" and "n" in the reference numbers indicates that any number of those elements having that nomenclature may be included in the system 1000.

The network 1004 may include any number of networks and/or network types. For example, the network 1004 may include, but is not limited to, one or more local area networks (LANs), wide area networks (WANs) (e.g., the Internet), virtual private networks (VPNs), mobile (cellular) networks, wireless wide area network (WWANs), WiMAX® networks, Bluetooth® communication networks, peer-to-peer networks, other interconnected data paths across which multiple devices may communicate, various combinations thereof, etc.

The computing devices 106a . . . 106n (also referred to individually and collectively as 106) are computing devices having data processing and communication capabilities. For instance, a computing device 106 may include a processor (e.g., virtual, physical, etc.), a memory, a power source, a network interface, and/or other software and/or hardware components, such as front and/or rear facing cameras, display, graphics processor, wireless transceivers, keyboard, camera, sensors, firmware, operating systems, drivers, various physical connection interfaces (e.g., USB, HDMI, etc.). The computing devices 106a . . . 106n may couple to and communicate with one another and the other entities of the system 1000 via the network 1004 using a wireless and/or wired connection. While two or more computing devices 106 are depicted in FIG. 10, the system 1000 may include any number of computing devices 106. In addition, the computing devices 106a . . . 106n may be the same or different types of computing devices.

As depicted in FIG. 10, one or more of the computing devices 106a . . . 106n may include a video capture device 1010 (also referred to elsewhere herein as a "camera"), a detection engine 1012, and activity application(s) 1014. One or more of the computing devices 106 and/or cameras 1010 may also be equipped with an adapter 104 as discussed elsewhere herein. The detection engine 1012 is capable of detecting and/or recognizing a visual marker as described elsewhere herein. The detection engine 1012 can detect the position and orientation of the visual marker.

In some implementations, the detection engine 1012 processes video captured by a camera 1010 to detect the visual marker. The activity application(s) 1014 are capable of determining the identity of the visual marker and provide calibration information to the calibrator 1102 based on the identity of the visual marker. Additional structure and functionality of the computing devices 106 are described in further detail below with reference to at least FIG. 11.

The servers 1002 may each include one or more computing devices having data processing, storing, and communication capabilities. For example, the servers 1002 may include one or more hardware servers, server arrays, storage devices and/or systems, etc., and/or may be centralized or distributed/cloud-based. In some implementations, the servers 1002 may include one or more virtual servers, which operate in a host server environment and access the physical hardware of the host server including, for example, a processor, memory, storage, network interfaces, etc., via an abstraction layer (e.g., a virtual machine manager).

The servers 1002 may include software applications operable by one or more computer processors of the servers 1002 to provide various computing functionalities, services, and/or resources, and to send data to and receive data from the computing devices 106. For example, the software applications may provide functionality for internet searching; social networking; web-based email; blogging; micro-blogging; photo management; video, music and multimedia hosting, distribution, and sharing; business services; news and media distribution; user account management; or any combination of the foregoing services. It should be understood that the servers 1002 are not limited to providing the above-noted services and may include other network-accessible services.

It should be understood that the system 1000 illustrated in FIG. 10 is provided by way of example, and that a variety of different system environments and configurations are contemplated and are within the scope of the present disclosure. For instance, various functionality may be moved from a server to a client, or vice versa and some implementations may include additional or fewer computing devices, services, and/or networks, and may implement various functionality client or server-side. Further, various entities of the system 1000 may be integrated into a single computing device or system or additional computing devices or systems, etc.

Figure 11:
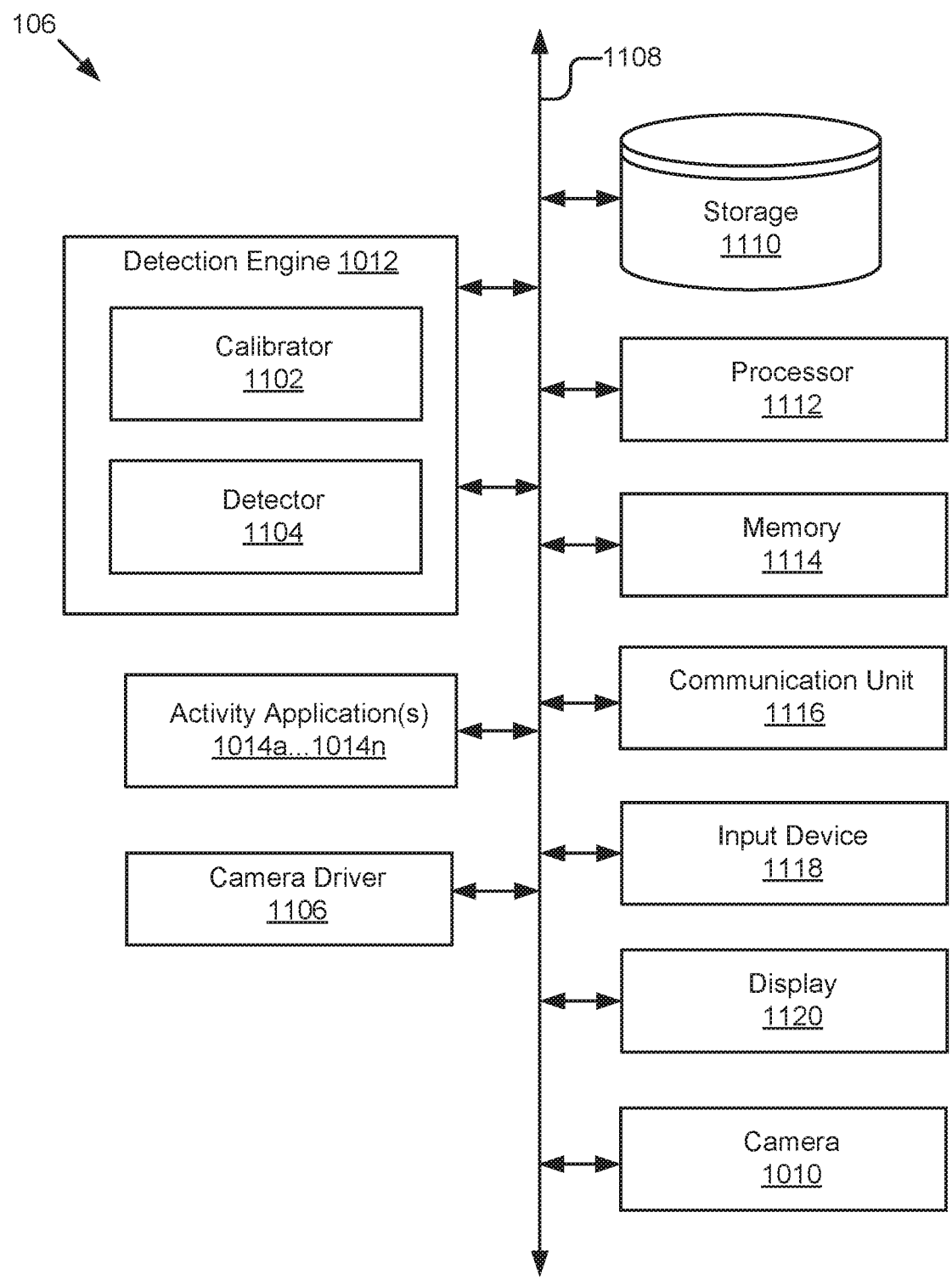
FIG. 11 is a block diagram illustrating an example computing device.

FIG. 11 is a block diagram of an example computing device 106. As depicted, the computing device 106 may include a processor 1112, memory 1114, communication unit 1116, display 1120, camera 1010, and an input device 1118, which are communicatively coupled by a communications bus 1108. However, it should be understood that the computing device 106 is not limited to such and may include other elements.

The processor 1112 may execute software instructions by performing various input/output, logical, and/or mathematical operations. The processor 1112 has various computing architectures to process data signals including, for example, a complex instruction set computer (CISC) architecture, a reduced instruction set computer (RISC) architecture, and/or an architecture implementing a combination of instruction sets. The processor 1112 may be physical and/or virtual, and may include a single core or plurality of processing units and/or cores.

The memory 1114 is a non-transitory computer-readable medium that is configured to store and provide access to data to the other elements of the computing device 106. In some implementations, the memory 1114 may store instructions and/or data that may be executed by the processor 1112. For example, the memory 1114 may store the detection engine 1012, the activity application(s) 1014, and the camera driver 1106. The memory 1114 is also capable of storing other instructions and data, including, for example, an operating system, hardware drivers, other software applications, data, etc. The memory 1114 may be coupled to the bus 1108 for communication with the processor 1112 and the other elements of the computing device 106.

The communication unit 1116 may include one or more interface devices (I/F) for wired and/or wireless connectivity with the network 1004 and/or other devices. In some implementations, the communication unit 1116 may include transceivers for sending and receiving wireless signals. For instance, the communication unit 1116 may include radio transceivers for communication with the network 1104 and for communication with nearby devices using close-proximity (e.g., Bluetooth®, NFC, etc.) connectivity. In some implementations, the communication unit 1116 may include ports for wired connectivity with other devices. For example, the communication unit 1116 may include a CAT-5 interface, Thunderbolt™ interface, FireWire™ interface, USB interface, etc.

The display 1120 may display electronic images and data output by the computing device 106 for presentation to a user 1030. The display 1120 may include any conventional display device, monitor or screen, including, for example, an organic light-emitting diode (OLED) display, a liquid crystal display (LCD), etc. In some implementations, the display 1120 may be a touch-screen display capable of receiving input from one or more fingers of a user 1030. For example, the display 1120 may be a capacitive touch-screen display capable of detecting and interpreting multiple points of contact with the display surface. In some implementations, the computing device 106 may include a graphics adapter (not shown) for rendering and outputting the images and data for presentation on display 1120. The graphics adapter (not shown) may be a separate processing device including a separate processor and memory (not shown) or may be integrated with the processor 1112 and memory 1114.

The input device 1118 may include any device for inputting information into the computing device 106. In some implementations, the input device 1118 may include one or more peripheral devices. For example, the input device 1118 may include a keyboard (e.g., a QWERTY keyboard), a pointing device (e.g., a mouse or touchpad), microphone, a camera, etc. In some implementations, the input device 1118 may include a touch-screen display capable of receiving input from the one or more fingers of the user 1030. For instance, the functionality of the input device 1118 and the display 1120 may be integrated, and a user 1030 of the computing device 106 may interact with the computing device 106 by contacting a surface of the display 1120 using one or more fingers. In this example, the user 1030 could interact with an emulated (i.e., virtual or soft) keyboard displayed on the touch-screen display 1120 by using fingers to contact the display 1120 in the keyboard regions.

The detection engine 1012 may include a detector 1104. The elements 1012 and 1104 may be communicatively coupled by the bus 1108 and/or the processor 1112 to one another and/or the other elements 1014, 1106, 1110, 1114, 1116, 1118, 1120, and/or 1010 of the computing device 106. In some implementations, one or more of the elements 1012 and 1104 are sets of instructions executable by the processor 1112 to provide their functionality. In some implementations, one or more of the elements 1012 and 1104 are stored in the memory 1114 of the computing device 106 and are accessible and executable by the processor 1112 to provide their functionality. In any of the foregoing implementations, these components 1012, and 1104 may be adapted for cooperation and communication with the processor 1112 and other elements of the computing device 106.

The detector 1104 includes software and/or logic for processing the video stream captured by the camera 1010 to detect the visual markers included in the video stream. The detector 1104 may be coupled to the storage 1110 via the bus 1108 to store, retrieve, and otherwise manipulate data stored therein. For example, the detector 1104 may query the storage 1110 for data matching any detected line segments to visual markers. In all of the above descriptions, the detector 1104 may send the detected images to the detection engine 1012 and the detection engine 1012 may perform the above described features.

The activity application(s) 1014 include software and/or logic for running an application on the computing device 106. The activity application(s) 1014 may be coupled to the detector 1104 via the processor 1112 and/or the bus 1108 to receive the information.

The camera driver 1106 includes software storable in the memory 1114 and operable by the processor 1112 to control/operate the camera 1010. For example, the camera driver 1106 is a software driver executable by the processor 1112 for signaling the camera 1010 to capture and provide a video stream and/or still image, etc. The camera driver 1106 is capable of controlling various features of the camera 1010 (e.g., flash, aperture, exposure, focal length, etc.). The camera driver 1106 may be communicatively coupled to the camera 1010 and the other components of the computing device 106 via the bus 1108, and these components may interface with the camera driver 1106 via the bus 1108 to capture video and/or still images using the camera 1010.

As discussed elsewhere herein, the camera 1010 is a video capture device configured to capture video of a surface including a play area proximate to the stand 102. The camera 1010 may be coupled to the bus 1108 for communication and interaction with the other elements of the computing device 106. The camera 1010 may include a lens for gathering and focusing light, a photo sensor including pixel regions for capturing the focused light and a processor for generating image data based on signals provided by the pixel regions. The photo sensor may be any type of photo sensor including a charge-coupled device (CCD), a complementary metal-oxide-semiconductor (CMOS) sensor, a hybrid CCD/CMOS device, etc. The camera 1010 may also include any conventional features such as a flash, a zoom lens, etc. The camera 1010 may include a microphone (not shown) for capturing sound or may be coupled to a microphone included in another component of the computing device 106 and/or coupled directly to the bus 1108. In some implementations, the processor of the camera 1010 may be coupled via the bus 1108 to store video and/or still image data in the memory 1114 and/or provide the video and/or still image data to other elements of the computing device 106, such as the detection engine 1012 and/or activity application(s) 1014. The storage 1110 is an information source for storing and providing access to stored data, such as calibration data, and/or any other information generated, stored, and/or retrieved by the activity application(s) 1014.

In some implementations, the storage 1110 may be included in the memory 1114 or another storage device coupled to the bus 1108. In some implementations, the storage 1110 may be or included in a distributed data store, such as a cloud-based computing and/or data storage system. In some implementations, the storage 1110 may include a database management system (DBMS). For example, the DBMS could be a structured query language (SQL) DBMS. For instance, storage 1110 may store data in an object-based data store or multi-dimensional tables comprised of rows and columns, and may manipulate, i.e., insert, query, update, and/or delete, data entries stored in the verification data store using programmatic operations (e.g., SQL queries and statements or a similar database manipulation library). Additional characteristics, structure, acts, and functionality of the storage 1110 is discussed elsewhere herein.

It should be understood that the above-described example activities are provided by way of illustration and not limitation and that numerous additional use cases are contemplated and encompassed by the present disclosure. In the above description, for purposes of explanation, numerous specific details are set forth in order to provide a thorough understanding of the present disclosure. However, it should be understood that the technology described herein may be practiced without these specific details. Further, various systems, devices, and structures are shown in block diagram form in order to avoid obscuring the description. For instance, various implementations are described as having particular hardware, software, and user interfaces. However, the present disclosure applies to any type of computing device that can receive data and commands, and to any peripheral devices providing services.

In some instances, various implementations may be presented herein in terms of algorithms and symbolic representations of operations on data bits within a computer memory. An algorithm is here, and generally, conceived to be a self-consistent set of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout this disclosure, discussions utilizing terms including "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Various implementations described herein may relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory or any type of media suitable for storing electronic instructions, each coupled to a computer system bus.

The technology described herein can take the form of a hardware implementation, a software implementation, or implementations containing both hardware and software elements. For instance, the technology may be implemented in software, which includes but is not limited to firmware, resident software, microcode, etc. Furthermore, the technology can take the form of a computer program product accessible from a computer-usable or computer-readable medium providing program code for use by or in connection with a computer or any instruction execution system. For the purposes of this description, a computer-usable or computer readable medium can be any non-transitory storage apparatus that can contain, store, communicate, propagate, or transport the program for use by or in connection with the instruction execution system, apparatus, or device.

A data processing system suitable for storing and/or executing program code may include at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems, storage devices, remote printers, etc., through intervening private and/or public networks. Wireless (e.g., Wi-Fi™) transceivers, Ethernet adapters, and modems, are just a few examples of network adapters. The private and public networks may have any number of configurations and/or topologies. Data may be transmitted between these devices via the networks using a variety of different communication protocols including, for example, various Internet layer, transport layer, or application layer protocols. For example, data may be transmitted via the networks using transmission control protocol/Internet protocol (TCP/IP), user datagram protocol (UDP), transmission control protocol (TCP), hypertext transfer protocol (HTTP), secure hypertext transfer protocol (HTTPS), dynamic adaptive streaming over HTTP (DASH), real-time streaming protocol (RTSP), real-time transport protocol (RTP) and the real-time transport control protocol (RTCP), voice over Internet protocol (VOIP), file transfer protocol (FTP), WebSocket (WS), wireless access protocol (WAP), various messaging protocols (SMS, MMS, XMS, IMAP, SMTP, POP, WebDAV, etc.), or other known protocols.

Finally, the structure, algorithms, and/or interfaces presented herein are not inherently related to any particular computer or other apparatus. Various general-purpose systems may be used with programs in accordance with the teachings herein, or it may prove convenient to construct more specialized apparatus to perform the required method blocks. The required structure for a variety of these systems will appear from the description above. In addition, the specification is not described with reference to any particular programming language. It will be appreciated that a variety of programming languages may be used to implement the teachings of the specification as described herein.

The foregoing description has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies and other aspects are not mandatory or significant, and the mechanisms that implement the specification or its features may have different names, divisions and/or formats.

Furthermore, the modules, routines, features, attributes, methodologies and other aspects of the disclosure can be implemented as software, hardware, firmware, or any combination of the foregoing. Also, wherever an element, an example of which is a module, of the specification is implemented as software, the element can be implemented as a standalone program, as part of a larger program, as a plurality of separate programs, as a statically or dynamically linked library, as a kernel loadable module, as a device driver, and/or in every and any other way known now or in the future. Additionally, the disclosure is in no way limited to implementation in any specific programming language, or for any specific operating system or environment. Accordingly, the disclosure is intended to be illustrative, but not limiting, of the scope of the subject matter set forth in the following claims.

What is claimed is:

1. A display positioning system comprising:
a stand including a front surface and a back surface, the front surface and the back surface being connected to form a curved bend such that a bottom edge of the front surface and a bottom edge of the back surface are spread out to support the stand, the front surface is further connected to a stand lip, the stand lip forming a stand channel between the front surface and an extended portion of the stand lip;
an insert, the insert being configured to rest within the stand channel of the stand using a centering feature to position the insert within the stand channel, and the insert including a front plate and a back plate that extend beyond a top portion of the insert and form an insert channel, the insert channel being positioned in a centered and elevated position relative to the stand channel, the insert channel being positioned at a height above a top surface of the stand, and the insert channel being configured to receive a first edge of a computing device and support the computing device in an elevated position; and
an adapter including an optical element, the adapter being configured to rest within a first slot in the stand when not in use.

2. The system of claim 1, wherein the adapter includes a second slot configured to receive a second edge of the computing device, the second edge located opposite the first edge of the computing device when the adapter is in use.

3. The system of claim 2, wherein the optical element rests at an angle within the adapter to redirect a field of view of a video capture device coupled to the computing device in the elevated position.

4. The system of claim 1, wherein the insert is removable and the stand channel is configured to receive the first edge of the computing device and support the computing device in a non-elevated position when the insert is removed.

5. The system of claim 1, wherein the adapter has a tapered shape to rest flush within the first slot.

6. The system of claim 1, wherein the adapter is secured within the first slot by magnetically coupling the adapter within the first slot of the stand.

7. The system of claim 1, wherein the elevated position allows the adapter to redirect a field of view of a video capture device of the computing device to a surface and the field of view of the video capture device includes a play area on the surface that is within the field of view based on the elevated position.

8. The system of claim 1, wherein the insert includes an insert visual marker detectable by the computing device.

9. The system of claim 8, wherein the insert visual marker detectable by the computing device represents to the computing device a configuration of the computing device.

10. The system of claim 1, wherein the stand includes a stand visual marker detectable by the computing device.

11. The system of claim 10, wherein the stand visual marker detectable by the computing device represents to the computing device a configuration of the computing device.

12. The system of claim 11, wherein the stand visual marker is one of a color, a graphical marker, a raised portion of the stand, a notch, and a separable component.

13. The system of claim 11, wherein the stand visual marker represents a calibration requirement of the computing device and the computing device may calibrate a video capture device based on the calibration requirement.

14. The system of claim 13, wherein the calibration requirement includes one of a height of the video capture device, a type of the computing device, and a type of the video capture device.

15. The system of claim 1, wherein the insert includes a magnetic coupling mechanism to retain the insert in place within the stand channel.

16. A platform for virtualization of a physical environment comprising:
a stand including a front surface and a back surface, the front surface and the back surface being joined with a curved bend along a top edge of the front surface and a top edge of the back surface such that the front surface and the back surface are positioned opposite each other and support the stand, the stand further comprises:
a stand lip, the stand lip being connected to the front surface and having an extended portion that extends upwards and forms a stand channel between the extended portion and the front surface, the stand channel being configured to receive a first edge of a computing device and brace the computing device in an angled position; and
a first slot, the first slot in a top side of the stand, the first slot being shaped to receive a camera adapter;
an insert configured to rest within the stand channel of the stand using a centering feature to position the insert within the stand channel and the insert including a front plate and a back plate that extend beyond a top portion of the insert and form an insert channel, the insert channel being positioned in a centered, elevated position relative to the stand channel, the insert channel being positioned at a height above a top surface of the stand; and
the adapter including a second slot and an optical element, the second slot being configured to receive a second edge of the computing device, the second edge located opposite the first edge of the computing device.

17. The platform of claim 16, wherein the insert is further configured to receive the first edge of the computing device and support the computing device in an elevated position.

18. The platform of claim 16, wherein the stand further comprises:
a cabling channel forming an access area in the stand that cables may be passed through and connect to the computing device when the stand channel receives the first edge of the computing device and braces the computing device in the angled position.

19. The platform of claim 16, wherein the curved bend is substantially high enough above that a hand of a user may fit between the curved bend and a surface that the stand is resting on and reposition the stand on the surface.

20. A display positioning system comprising:
a stand configured to rest on a surface, the stand including a stand channel, a first slot to secure an adapter when the adapter is not in use, and a visualization marker;
an insert, the insert being configured to rest within the stand channel of the stand and the insert including an insert channel, the insert channel being positioned at a height above a top surface of the stand and configured to receive a first edge of a computing device and position the computing device in an angled position in the insert channel;
the adapter including a second slot and an optical element, the second slot receiving a second edge of the computing device so as to redirect a field of view of at least a portion of a video capture device of the computing device; the adapter being secured within the first slot when not in use; and
the computing device, the computing device further comprising:
the video capture device being configured to capture a video stream of the redirected field of view including the visualization marker;
a detector being configured to detect the visualization marker in the captured video stream; and
a calibrator being configured to calibrate the video stream based on the visualization marker.

* * * * *